(12) United States Patent
Oh et al.

(10) Patent No.: US 8,878,201 B2
(45) Date of Patent: Nov. 4, 2014

(54) ORGANIC LIGHT-EMITTING DISPLAY APPARATUS

(75) Inventors: Min-Ho Oh, Yongin (KR);
Yoon-Hyeung Cho, Yongin (KR);
Byoung-Duk Lee, Yongin (KR);
Yong-Tak Kim, Yongin (KR); So-Young Lee, Yongin (KR); Yun-Ah Chung, Yongin (KR)

(73) Assignee: Samsung Display Co., Ltd., Gyeonggi-do (KR)

( * ) Notice: Subject to any disclaimer, the term of this patent is extended or adjusted under 35 U.S.C. 154(b) by 648 days.

(21) Appl. No.: 13/088,912

(22) Filed: Apr. 18, 2011

(65) Prior Publication Data

US 2012/0153308 A1 Jun. 21, 2012

(30) Foreign Application Priority Data

Dec. 16, 2010 (KR) .................. 10-2010-0129285

(51) Int. Cl.
*H01L 29/18* (2006.01)
*H01L 33/00* (2010.01)
*H01L 51/52* (2006.01)

(52) U.S. Cl.
CPC ................... *H01L 51/5253* (2013.01)
USPC ........ 257/88; 257/100; 257/99; 257/E51.018; 257/E33.059; 257/E33.053

(58) Field of Classification Search
CPC ............ H01L 51/5236; H01L 51/5253; H01L 51/5256; H01L 51/5246
USPC .............. 257/100, E51.018, 88, E33.059, 99, 257/E33.053
See application file for complete search history.

(56) References Cited

U.S. PATENT DOCUMENTS

| 6,635,989 | B1 | 10/2003 | Nilsson et al. | |
|---|---|---|---|---|
| 7,067,976 | B2 | 6/2006 | Yamazaki | |
| 2003/0085652 | A1 | 5/2003 | Weaver | |
| 2004/0197944 | A1 | 10/2004 | Chen et al. | |
| 2007/0152212 | A1* | 7/2007 | Cho et al. ......................... | 257/40 |
| 2008/0203907 | A1* | 8/2008 | Lee et al. ....................... | 313/504 |
| 2009/0058268 | A1 | 3/2009 | Yoshida et al. | |
| 2013/0069105 | A1* | 3/2013 | Shi ................................ | 257/100 |

FOREIGN PATENT DOCUMENTS

KR 10-2004-0085675 A 10/2004

* cited by examiner

*Primary Examiner* — Phat X Cao
*Assistant Examiner* — Diana C Vieira
(74) *Attorney, Agent, or Firm* — Knobbe, Martens, Olson & Bear, LLP

(57) ABSTRACT

An organic light-emitting display apparatus is disclosed. In one embodiment, the display apparatus includes i) a substrate and ii) an organic light-emitting device formed on the substrate, the organic light-emitting device including a stack structure including a first electrode, an organic light-emitting layer, and a second electrode. The apparatus may further include a sealing layer formed on the substrate so as to cover the organic light-emitting device, the sealing layer including an inorganic layer and a porous layer interposed between the sealing layer and the organic light-emitting device. One embodiment can reduce a stress due to a sealing inorganic layer so as to maintain characteristics for a long time in a severe environment and not affect an organic light-emitting device.

22 Claims, 7 Drawing Sheets

ORGANIC LIGHT-EMITTING DISPLAY APPARATUS

CROSS-REFERENCE TO RELATED PATENT APPLICATION

This application claims the benefit of Korean Patent Application No. 10-2010-0129285, filed on Dec. 16, 2010, in the Korean Intellectual Property Office, the disclosure of which is incorporated herein in its entirety by reference.

BACKGROUND

1. Field

The described technology generally relates to organic light-emitting display apparatuses, and more particularly, to organic light-emitting display apparatuses having an improved sealing structure.

2. Description of the Related Technology

Organic light-emitting displays generally have wide viewing angles, high contrast ratios, short response times, and reduced power consumption, and thus may be used across a variety of applications such as personal portable devices (e.g., MP3 players and mobile phones) or large screen displays (e.g., television sets).

The performance of an organic light-emitting display may deteriorate due to permeation of oxygen or moisture. Therefore, an organic light-emitting display generally includes a sealing structure for blocking permeation of oxygen and moisture.

SUMMARY

One inventive aspect is an organic light-emitting display apparatus for reducing a stress due to a sealing inorganic layer so as to maintain characteristics for a long time also in a severe environment and not affect an organic light-emitting device.

Another aspect is an organic light-emitting display apparatus including a substrate; an organic light-emitting device formed on the substrate, the organic light-emitting device including a stack structure including a first electrode, an organic light-emitting layer, and a second electrode; a sealing layer formed on the substrate so as to cover the organic light-emitting device, the sealing layer including an inorganic layer; and a porous layer interposed between the sealing layer and the organic light-emitting device.

The porous layer may contact the second electrode of the organic light-emitting device. The sealing layer may prevent the organic light-emitting device and the porous layer from being exposed out of the organic light-emitting display apparatus. The inorganic layer of the sealing layer may contact the porous layer.

The porous layer may include a first porous layer and a second porous layer, and a density of the first porous layer may be different from a density of the second porous layer. The first porous layer may contact the second electrode, and the density of the first porous layer may be lower than the density of the second porous layer.

The porous layer may have a density gradient that gradually changes in a thickness direction. The porous layer may include an inorganic material. The porous layer may include an organic material.

Another aspect is an organic light-emitting display apparatus including a substrate; an organic light-emitting device formed on the substrate, the organic light-emitting device including a stack structure including a first electrode, an organic light-emitting layer, and a second electrode; a first layer contacting the organic light-emitting device, the first layer including a porous layer; and a second layer formed on the substrate so as to cover the organic light-emitting device and a first layer, contacting the first layer, and including an inorganic layer.

The first layer may contact the second electrode of the organic light-emitting device. The second layer may prevent the organic light-emitting device and the first layer from being exposed out of the organic light-emitting display apparatus. An inorganic layer of the second layer may contact the first layer.

The porous layer may include a first porous layer and a second porous layer, and a density of the first porous layer may be different from a density of the second porous layer. The first porous layer may contact the second porous layer, and the density of the first porous layer may be lower than the density of the second porous layer.

The porous layer may have a density gradient that gradually changes in a thickness direction. The porous layer may include an inorganic material. The first layer may include an inorganic material. The first layer may further include an inorganic layer that contacts the porous layer. The porous layer may include an organic material.

DETAILED DESCRIPTION

A thin-film sealing structure using an organic layer and an inorganic layer has been used as a sealing structure for an organic light-emitting display. In addition, a high-density inorganic layer is used in the thin-film sealing structure to effectively prevent the penetration of moisture and air into the display.

However, the high-density inorganic layer causes pressure or tension stress in a thin display application. Such stress affects an OLED beneath the high-density inorganic layer when environmental conditions reach high temperatures and high relative humidity.

If the sealing structure is designed to solely improve barrier characteristics of the inorganic layer only, there may be a tradeoff with other factors. For example, when the sealing structure undergoes severe ambient conditions, a relatively thin and flexible OLED may be harmed. In that case, the lifetime of the organic light-emitting device may be reduced.

Embodiments will now be described more fully with reference to the accompanying drawings.

Figure 1:
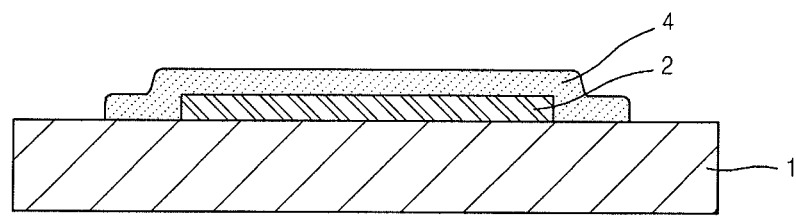
FIG. 1 is a cross-sectional view of an organic light-emitting display apparatus according to an embodiment.
Figure 2:
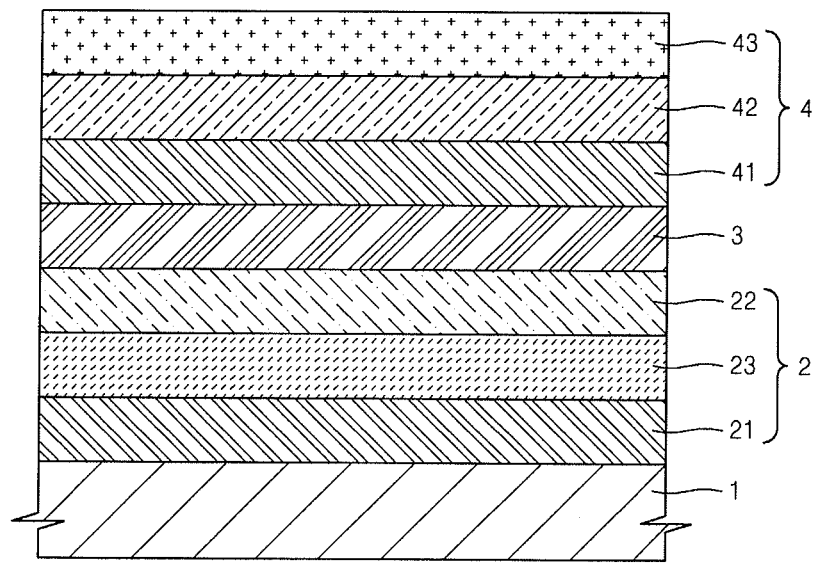
FIG. 2 is a cross-sectional view of a portion of a single pixel of the organic light-emitting display apparatus of FIG. 1.

FIG. 1 is a cross-sectional view of an organic light-emitting display apparatus according to an embodiment. FIG. 2 is a cross-sectional view of a portion of a single pixel of the organic light-emitting display apparatus of FIG. 1.

Referring to FIGS. 1 and 2, an organic light-emitting device 2 is formed on a substrate 1, and a second layer 4 as a sealing layer is formed on the substrate 1 so as to cover the organic light-emitting device 2.

The substrate 1 may be formed at least partially of a glass material, but is not limited thereto, and the substrate 1 may be formed at least partially of metal or plastic.

Although not illustrated in FIGS. 1 and 2, the substrate 1 may include a single pixel circuit per pixel, and the pixel circuit may include at least one thin film transistor (TFT) and a capacitor.

As illustrated in FIG. 2, the organic light-emitting device 2 includes a first electrode 21, a second electrode 22, and an organic light-emitting layer 23 interposed between the first electrode 21 and the second electrode 22.

The first electrode 21 is electrically connected to the TFT included in the substrate 1.

The first and second electrodes 21 and 22 face each other and are electrically insulated from each other by the organic light-emitting layer 23.

The first and second electrodes 21 and 22 may function as an anode and a cathode, respectively, or polarities of the first electrode 21 and the second electrode 22 may be opposite to this.

When the first electrode 21 is used as an anode, the first electrode 21 may be formed of a material with a high absolute value of a work function. When the second electrode 22 is used as a cathode, the second electrode 22 may be formed of a material of a lower absolute value of a work function than that of the first electrode 21. When the polarities of the first and second electrodes 21 and 22 are opposite to this, the materials of the electrodes 21 and 22 may be opposite to the ones where the electrodes 21 and 22 function as an anode and a cathode. Hereinafter, a case where the first electrode 21 is used as an anode and the second electrode 22 is used as a cathode will be described.

The first electrode 21 may be formed at least partially of a transparent metal oxide selected from at least one of indium tin oxide (ITO), indium zinc oxide (IZO), ZnO, and $In_2O_3$. The second electrode 22 may be formed at least partially of at least one metal selected from aluminum (Al), silver (Ag), magnesium (Mg) and chromium (Cr).

When the organic light-emitting display apparatus is a bottom emission type display apparatus where an image is realized towards the substrate 1, the second electrode 22 may be formed to be relatively thick, thereby increasing the luminescent efficiency towards the substrate 1.

When the organic light-emitting display apparatus is of a top emission type display apparatus where an image is related towards the second layer 4, the second electrode 22 may function as a semi-transmissive reflective layer by forming the second electrode 22 to be thin. Alternatively, the second electrode 22 may be formed of a transparent conductive material other than the above-described materials. In this case, the first electrode 21 may further include a reflective layer.

In one embodiment, the organic light-emitting layer 23 has a stack structure in which a plurality of organic layers including an emission layer (EML) are staked. A hole transport layer (HTL), a hole injection layer (HIL), or the like may be disposed between the EML and the first electrode 21, and an electron transport layer (ETL), an electron injection layer (EIL), or the like may be disposed between the EML and the second electrode 22.

In FIG. 2, the second layer 4 may have a stack structure in which an organic layer 42 is interposed between a first inorganic layer 41 and a second inorganic layer 43. However, the present embodiment is not limited thereto, and the second layer 4 may have a stack structure in which a plurality of inorganic layers and a plurality of organic layers are alternately stacked.

A first layer 3 is interposed between the second layer 4 and the organic light-emitting device 2.

The first layer 3 contacts each of the organic light-emitting device 2 and the second layer 4, and prevents a stress from increasing due to an organic layer included in the second layer 4. The first layer 3 may contact the second electrode 22 of the organic light-emitting device 2. In addition, the first layer 3 may contact the first inorganic layer 41 of the second layer 4. In this case, the first layer 3 may further prevent the stress from increasing. To this end, the first layer 3 may include a porous layer.

Since the first layer 3 includes a porous layer, a function of reducing the stress by the first layer 3, instead of a function of preventing the penetration of moisture and air by the second layer 5, may be further improved.

Since the porous layer is formed of an inorganic material, the first layer 3 may prevent the stress from increasing due to the second layer 4, in particular, due to at least one of the first and second inorganic layers 41 and 43.

The porous layer of the first layer 3 may be formed at least partially of an inorganic material such as SiNx, SiOx, SiCN, SiON, or the like, and may be formed using a plasma-enhanced chemical vapor deposition (PECVD) method with a low density. That is, during the PECVD method, the porous layer may be formed with a reduced plasma ion density.

A thickness of the first layer 3 may be smaller than that of the second layer 4. If the thickness the first layer 3 is greater than that of the second layer 4, since tranmissivity for visible rays is reduced in a top emission type display apparatus, the first layer 3 may be formed to have a minimum thickness as long as the stress due to the second layer 4 is prevented. The thickness of the first layer 3 may be smaller than that of the first inorganic layer 41 of the second layer 4.

In FIG. 2, the first layer 3 includes a single porous layer, but the present embodiment is not limited thereto, and the porous layer may be variously formed.

Figure 3:
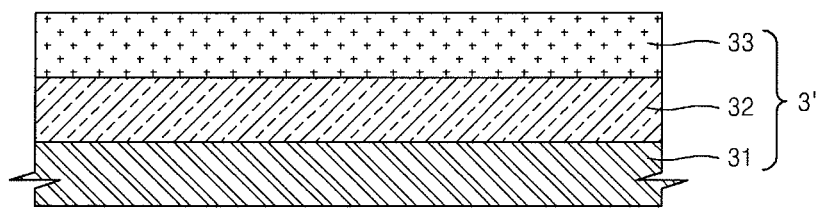
FIG. 3 is a cross-sectional view of a first layer according to another embodiment.

For example, FIG. 3 is a cross-sectional view of a first layer 3' according to another embodiment. Referring to FIG. 3, the first layer 3' includes a plurality of porous layers. The porous layers may have at least two porous layers with different densities. In FIG. 3, the first layer 3' has a stack structure including a first porous layer 31, a second porous layer 32, and a third porous layer 33.

In one embodiment, the porous layers 31-33 have different layer densities. In one embodiment, the first porous layer 31 has the lowest density. In this embodiment, the third porous layer 33 has the highest density. That is, the porous layers may have a density gradient formed in such a way that density increases from the first porous layer 31 to the third porous layer 33. The density gradient may be substantially gradually increased.

The first layer 3' including a plurality of porous layers may have a greater thickness than the thickness of the first layer 3 as shown in FIG. 2 including a single porous layer.

Figure 4:
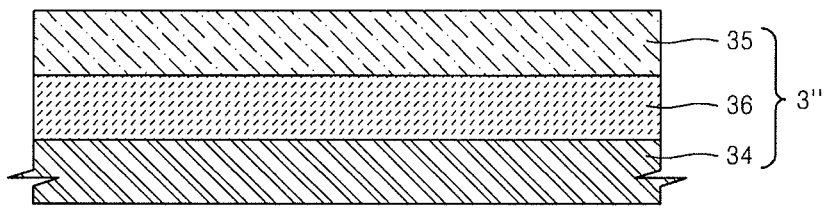
FIG. 4 is a cross-sectional view of a first layer according to another embodiment.

FIG. 4 is a cross-sectional view of a first layer 3" according to another embodiment.

The first layer 3" is formed at least partially of SiCN by using a PECVD method. A fourth porous layer 36 formed of, for example, carbon or a carbon-containing material is formed between a third inorganic layer 34 and a fourth inorganic layer 35 formed of SiN.

The fourth porous layer 36 formed of carbon may not have barrier characteristics, and may prevent a stress from increasing due to the first layer 3" including an inorganic layer and the second layer 4 formed on the first layer 3".

Figure 5:
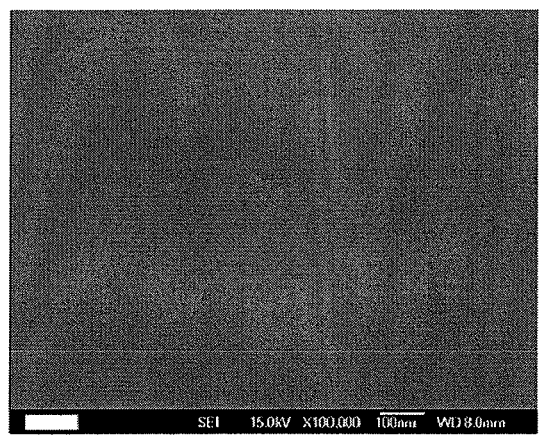
FIG. 5 is a transmission electron microscope (TEM) image of a high-density SiNx layer formed on an organic light-emitting device.
Figure 6:
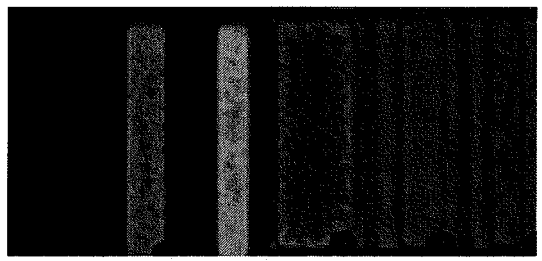
FIG. 6 shows a pixel formed by alternately forming organic layers and inorganic layers on the high-density SiNx layer to form a thin-film sealing structure and then maintaining the thin-film sealing structure at high temperatures and high moistures for about 100 hours.

FIG. 5 is a transmission electron microscope (TEM) image of a high-density SiNx layer formed on an organic light-emitting device. FIG. 6 shows a pixel formed by alternately forming organic layers and inorganic layers on the high-density SiNx layer to form a thin-film sealing structure and then maintaining the thin-film sealing structure at high temperatures and high moistures for about 100 hours. In FIG. 6, a left side shows a light-emitting state, and a right side shows a non-emitting state.

The high density SiNx layer has excellent barrier characteristics due to a high density. However, since the high density SiNx layer influences an organic light-emitting device formed below the high density SinX layer due to a strong stress, dark spots are shown, as illustrated in FIG. 6.

Figure 7:
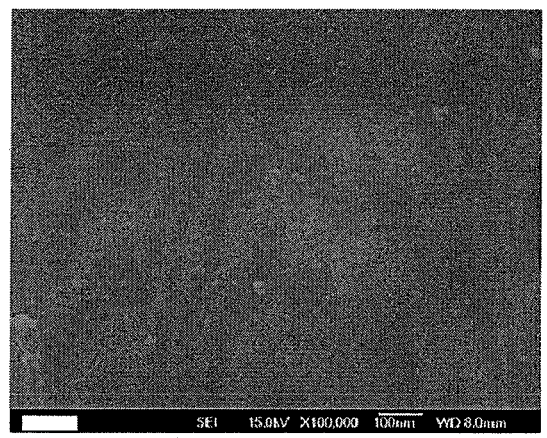
FIG. 7 is a TEM image of a porous SiNx layer having almost no barrier characteristics.
Figure 8:
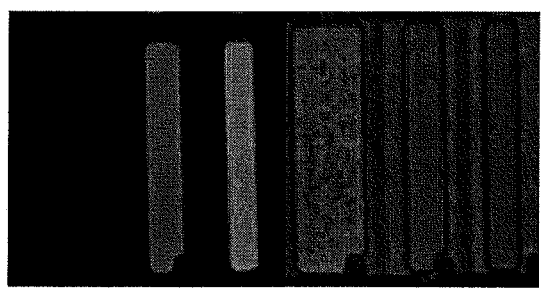
FIG. 8 is a TEM image of a pixel formed by interposing the porous SiNx layer between the thin-film sealing structure and the organic light-emitting device and then maintaining the resulting structure at high temperatures and high moistures for about 240 hours.

FIG. 7 is a TEM image of a porous SiNx layer having almost no barrier characteristics. FIG. 8 is a TEM image of a pixel formed by interposing the porous SiNx layer between the thin-film sealing structure and the organic light-emitting device and then maintaining the resulting structure at high temperatures and high moistures for about 240 hours. In FIG. 8, a left side shows a light-emitting state and a right side shows a non-emitting state.

Likewise, by further interposing the porous SiNx layer with almost no barrier characteristics, the number of black spots may be reduced, as shown in FIG. 6.

Figure 9:
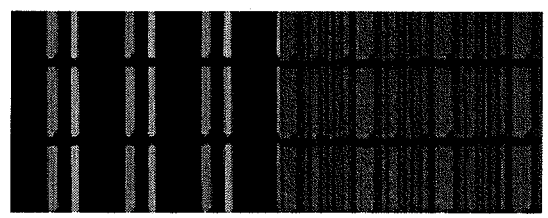
FIG. 9 is a TEM image of a pixel formed by forming a layer shown in FIG. 3 while dividing a porous SiNx layer into three layers to increase a plasma ion density to a third level and then maintaining the resulting structure at high temperatures and high moistures for about 500 hours.

FIG. 9 is a TEM image of a pixel formed by forming a layer as shown in FIG. 3 by dividing a porous SiNx layer into three layers to increase a plasma ion density to a third level and then maintaining the resulting structure at high temperatures and high moistures for about 500 hours.

As shown in FIG. 9, even though a severe environment is maintained for a long period of time, the number of black spots is reduced.

A structure with no black spots, that is, the porous SiNx layer, has almost no barrier characteristics. The porous SiNx layer prevents a stress. The porous layer has a higher Si—H bonding ratio and a lower Si—N bonding ratio than that of a SiNx layer having a barrier characteristics. Thus, the porous SiNx layer may be formed to have a high Si—H bonding ratio in order to prevent the stress from increasing.

Figure 10:
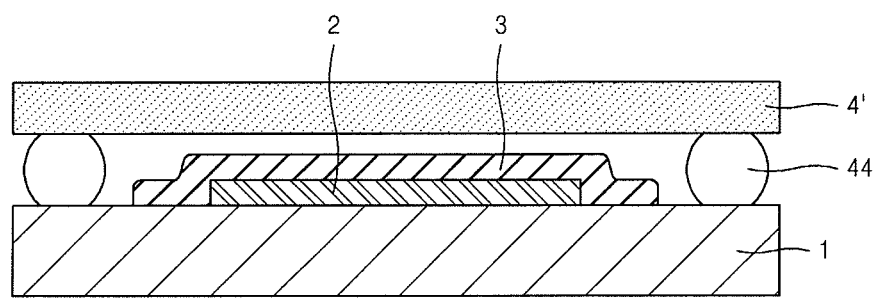
FIG. 10 is a cross-sectional view of an organic light-emitting display apparatus according to another embodiment.

The porous SiNx layer is not used only in the above-described sealing structure. As shown in FIG. 10, in a structure in which a sealing substrate 4' is adhered to the substrate 1 by a sealing member 44, the first layer 3 may be used as a passivation layer for covering the organic light-emitting device 2. Alternatively, as shown in FIG. 1, the second layer 4 may be further formed also on the passivation layer. In addition, the structures show in FIGS. 2 through 4 may be used as the first layer 3.

A first layer as a porous layer does not have to contact a second electrode. In addition, when the first layer is interposed between the second electrode and an inorganic layer as a high-density barrier layer, the first layer may effectively prevent a stress, thereby preventing minute black spots of a pixel from forming.

Figure 11:
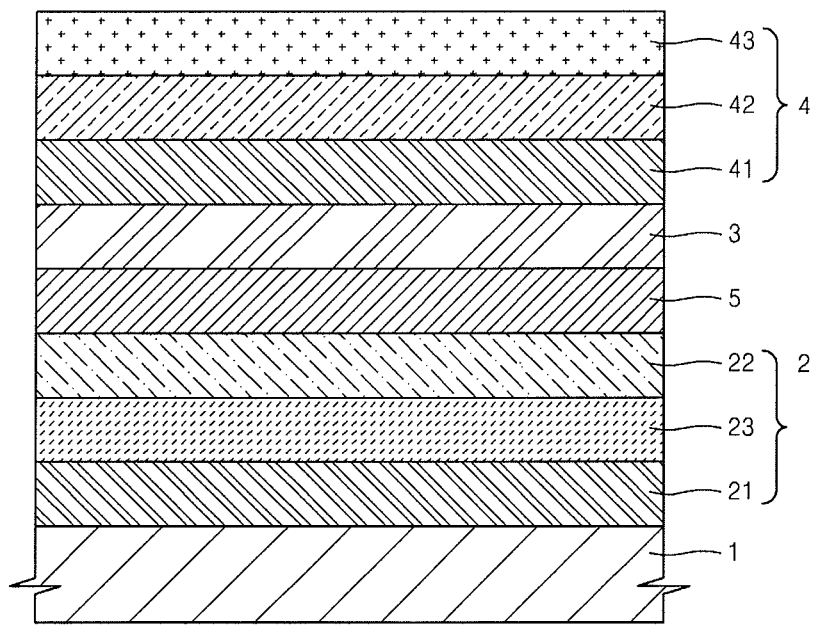
FIG. 11 is a cross-sectional view of a single pixel of FIG. 1 according to an embodiment.

That is, as shown in FIG. 11, a capping layer 5 that is a thin inorganic layer for realizing resonance of the organic light-emitting device 2 may be formed on the second electrode 22, the first layer 3 may be formed on the capping layer 5, and the second layer 4 may be further formed on the first layer 3.

Figure 12:
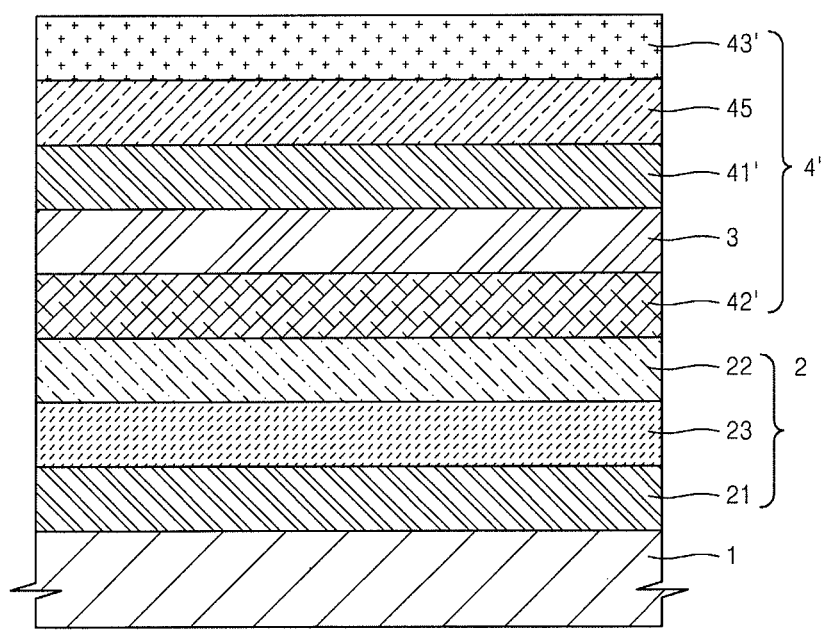
FIG. 12 is a cross-sectional view of a single pixel of FIG. 1 according to an embodiment.

As shown in FIG. 12, the first layer 3 as the porous layer may be included in a second layer 4' as a sealing layer. That is, a first organic layer 42' of the second layer 4' as a sealing layer is formed on the second electrode 22, and then the first layer 3 is formed on the first organic layer 42'. A sealing layer formed by sequentially forming a first inorganic layer 41', a second organic layer 45, and a second inorganic layer 43' is formed on the first layer 3. In this structure, since the first inorganic layer 41' and the second inorganic layer 43' constitute a high-density barrier, a stress may be increased. However, the stress may be reduced by interposing the first layer 3 between the first inorganic layer 41' and the first organic layer 42', thereby preventing minute black spots from being formed.

Figure 13:
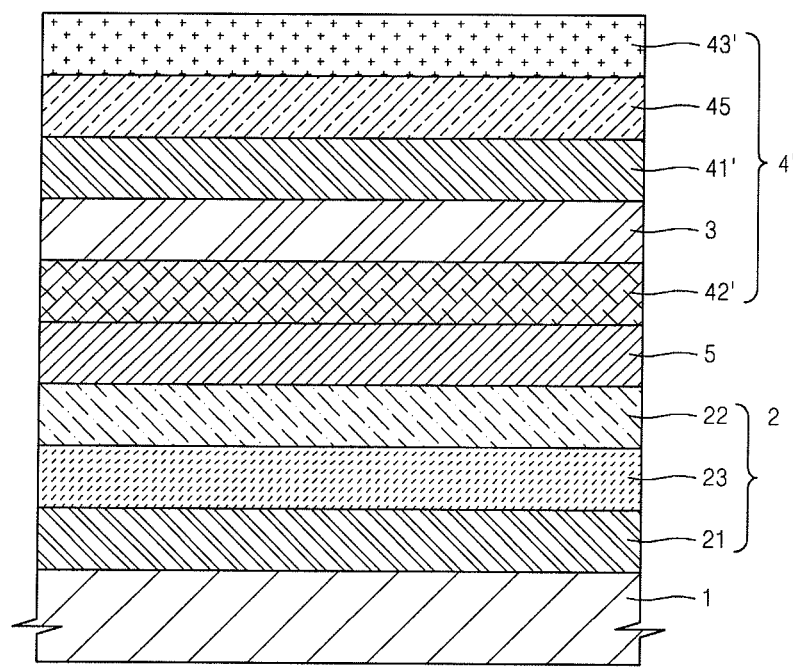
FIG. 13 is a cross-sectional view of a single pixel of FIG. 1 according to an embodiment.

FIG. 13 is a cross-sectional view of a single pixel formed by applying the pixels of FIGS. 11 and 12, according to another embodiment. The pixel of FIG. 13 is formed by further interposing a capping layer 5 of FIG. 11 between the second electrode 22 and the first organic layer 42' of FIG. 12. Also, since the first and second inorganic layers 41' and 43' constitute a high-density barrier, a stress may be increased. However, the stress may be reduced by interposing the first layer 3 between the first inorganic layer 41' and the first organic layer 42', thereby preventing minute black spots from being formed.

Also, in FIGS. 11 through 13, the stack order and the number of layers included in the second layer 4 or 4' are not particularly limited. That is, a plurality of organic layers and a plurality of inorganic layers may be further and alternately stacked, which may also be applied to the structure of FIG. 10.

According to at least one of the disclosed embodiments, an organic light-emitting device may not be substantially affected by a stress due to a layer covering the organic light-emitting device, thereby preventing minute black spots of each pixel from being formed, and maintaining luminescent characteristics for a long time.

While embodiments have been shown and described with reference to the accompanying drawings, it will be understood by those of ordinary skill in the art that various changes in form and details may be made therein without departing from the spirit and scope of the following claims.

What is claimed is:
1. An organic light-emitting display apparatus comprising:
a substrate;
an organic light-emitting device formed on the substrate, wherein the organic light-emitting device has a stack structure which comprises a first electrode, an organic light-emitting layer, and a second electrode;

a sealing layer formed on the substrate so as to cover the organic light-emitting device, wherein the sealing layer comprises an inorganic layer and an organic layer formed on the inorganic layer; and a porous layer interposed between the sealing layer and the organic light-emitting device, wherein the inorganic layer is formed on the porous layer, and wherein the inorganic layer is thicker than the porous layer.

2. The organic light-emitting display apparatus of claim 1, wherein the porous layer contacts the second electrode of the organic light-emitting device.

3. The organic light-emitting display apparatus of claim 1, further comprising at least one of an inorganic layer and an organic layer, which is interposed between the organic light-emitting device and the porous layer.

4. The organic light-emitting display apparatus of claim 1, wherein the sealing layer is configured to prevent the organic light-emitting device and the porous layer from being exposed out of the organic light-emitting display apparatus.

5. The organic light-emitting display apparatus of claim 1, wherein the inorganic layer of the sealing layer contacts the porous layer.

6. The organic light-emitting display apparatus of claim 1, wherein the porous layer comprises a first porous layer and a second porous layer, and
wherein the density of the first porous layer is different from the density of the second porous layer.

7. The organic light-emitting display apparatus of claim 6, wherein the first porous layer faces the second electrode, and
wherein the density of the first porous layer is lower than the density of the second porous layer.

8. The organic light-emitting display apparatus of claim 1, wherein the porous layer has a density gradient that substantially gradually changes in a direction corresponding to its cross-section.

9. The organic light-emitting display apparatus of claim 1, wherein the porous layer comprises an inorganic material with a lower density than the inorganic layer of the sealing layer.

10. The organic light-emitting display apparatus of claim 1, wherein the porous layer comprises an organic material.

11. An organic light-emitting display apparatus comprising:
a substrate;
an organic light-emitting device formed on the substrate, wherein the organic light-emitting device has a stack structure which comprises a first electrode, an organic light-emitting layer, and a second electrode;
a first layer contacting the organic light-emitting device, wherein the first layer comprises a porous layer; and
a second layer formed on the substrate so as to cover the organic light-emitting device and the first layer, wherein the second layer contacts the first layer and comprises an inorganic layer formed on the porous layer and an organic layer formed on the inorganic layer, wherein the inorganic layer contacts the porous layer, and wherein the inorganic layer is thicker than the porous layer.

12. The organic light-emitting display apparatus of claim 11, wherein the first layer contacts the second electrode of the organic light-emitting device.

13. The organic light-emitting display apparatus of claim 11, further comprising at least one of an inorganic layer and an organic layer, which is interposed between the organic light-emitting device and the first layer.

14. The organic light-emitting display apparatus of claim 11, wherein the second layer is configured to prevent the organic light-emitting device and the first layer from being exposed out of the organic light-emitting display apparatus.

15. The organic light-emitting display apparatus of claim 11, wherein the inorganic layer of the second layer contacts the first layer.

16. The organic light-emitting display apparatus of claim 11, wherein the porous layer comprises a first porous layer and a second porous layer, and
wherein the density of the first porous layer is different from the density of the second porous layer.

17. The organic light-emitting display apparatus of claim 16, wherein the first porous layer faces the second electrode, and
wherein the density of the first porous layer is lower than the density of the second porous layer.

18. The organic light-emitting display apparatus of claim 11, wherein the porous layer has a density gradient that gradually changes in a direction corresponding to its cross-section.

19. The organic light-emitting display apparatus of claim 11, wherein the porous layer comprises an inorganic material with a lower density than the inorganic layer of the second layer.

20. The organic light-emitting display apparatus of claim 11, wherein the first layer comprises an inorganic material.

21. The organic light-emitting display apparatus of claim 11, wherein the first layer further comprises an inorganic layer that contacts the porous layer.

22. The organic light-emitting display apparatus of claim 11, wherein the porous layer comprises an organic material.

* * * * *